United States Patent [19]
Yamamoto et al.

[11] Patent Number: 5,801,603
[45] Date of Patent: Sep. 1, 1998

[54] LADDER-TYPE FILTER COMPRISING STACKED PIEZOELECTRIC RESONATORS

[75] Inventors: Takashi Yamamoto, Ishikawa-ken; Tetsuo Takeshima, Toyama, both of Japan

[73] Assignee: Murata Manufacturing Co., Ltd., Kyoto-fu, Japan

[21] Appl. No.: 726,245

[22] Filed: Oct. 4, 1996

[30] Foreign Application Priority Data

Apr. 1, 1996 [JP] Japan ................................ 8-106231

[51] Int. Cl.$^6$ ................. H03H 9/10; H03H 9/205; H03H 9/54
[52] U.S. Cl. ................................ 333/189; 310/348
[58] Field of Search .......................... 333/186, 189, 333/192; 310/348, 365–368

[56] References Cited

U.S. PATENT DOCUMENTS

| | | | |
|---|---|---|---|
| 4,323,865 | 4/1982 | Tanaka et al. | 333/189 X |
| 4,523,121 | 6/1985 | Takahashi et al. | 310/334 |
| 4,633,120 | 12/1986 | Sato et al. | 310/328 |
| 5,159,228 | 10/1992 | Schaetzle | 310/338 |
| 5,250,868 | 10/1993 | Shirasu | 310/328 |
| 5,260,675 | 11/1993 | Ogawa et al. | 333/189 |
| 5,343,109 | 8/1994 | Möckl | 310/334 |
| 5,400,001 | 3/1995 | Asakawa et al. | 333/186 |
| 5,525,944 | 6/1996 | Oyama | 333/189 |
| 5,598,133 | 1/1997 | Fuse | 333/189 |

OTHER PUBLICATIONS

Jumonji, "High–Impedance Piezoelectric Ceramic Resonators and Their Application to Ladder Filters"; *Electronics and Communications in Japan*, vol. 53–A, No. 8; pp. 17–23, 1970.

*Primary Examiner*—Robert J. Pascal
*Assistant Examiner*—Barbara Summons
*Attorney, Agent, or Firm*—Graham & James LLP

[57] ABSTRACT

A ladder-type filter includes a base substrate serving as a support substrate. A resonator group is supported on the surface of the base substrate. The resonator group includes first, second, third and fourth resonators, all of which have an electrode formed on each of a first side and a second side of their respective piezoelectric substrates. The first to fourth resonators are stacked and mechanically bonded to form layers and electrically connected in a ladder shape by conductive bonding agents providing mechanical and electrical connection.

22 Claims, 11 Drawing Sheets

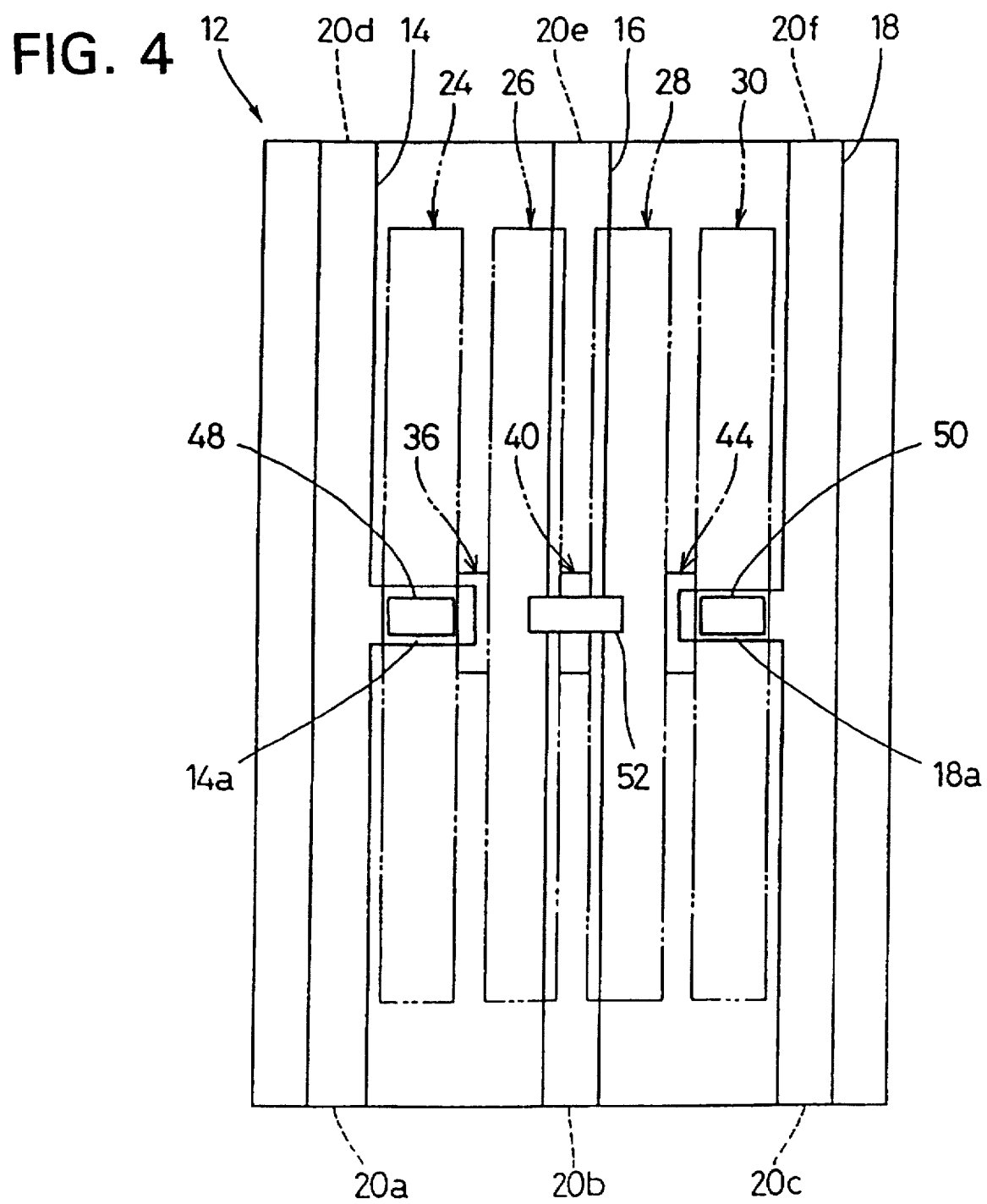

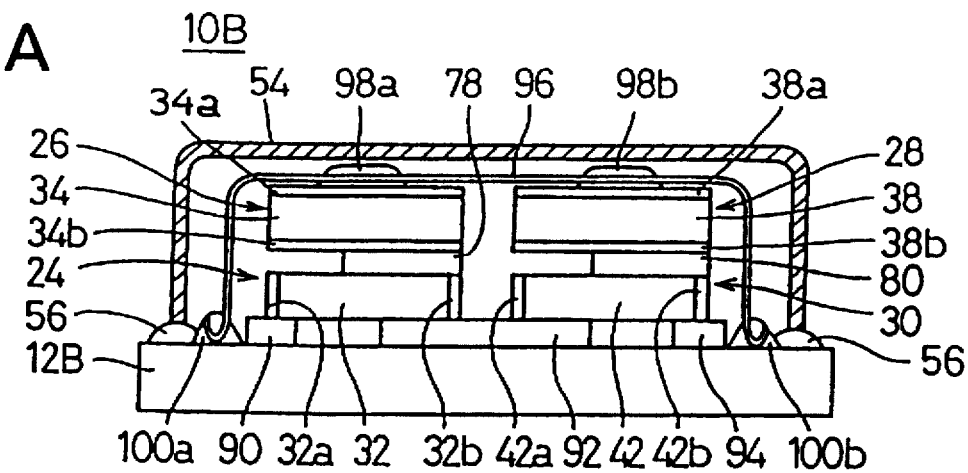
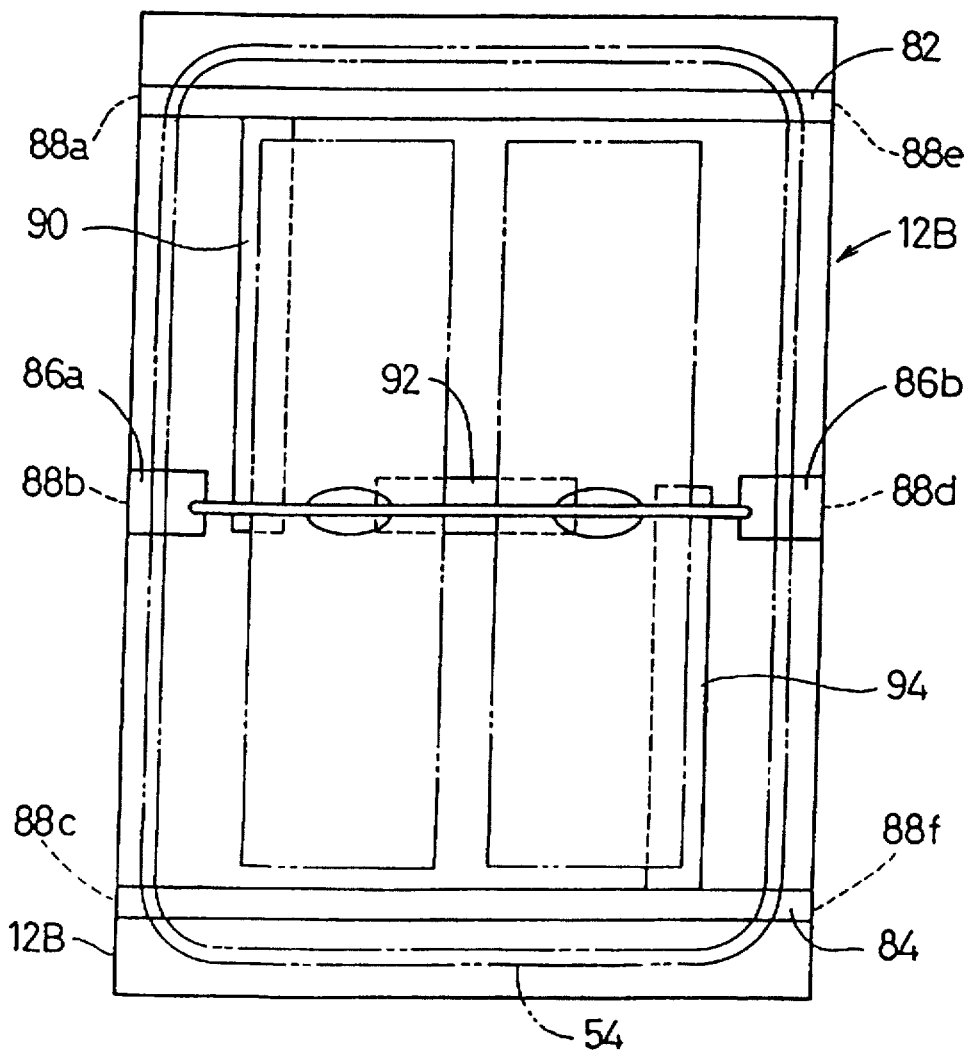

LADDER-TYPE FILTER COMPRISING STACKED PIEZOELECTRIC RESONATORS

BACKGROUND OF THE INVENTION

1. Field of the Invention

The present invention relates to a ladder-type filter and, more particularly, to a ladder-type filter for use in, for example, a piezoelectric ceramic filter.

2. Description of the Related Art

FIG. 13 is a partial sectional view illustrating an example of a conventional ladder-type filter which forms the background of the present invention.

A ladder-type filter 1 includes a resin case 2 in the shape of a box. Provided inside the case 2 are two piezoelectric resonators 3 and 4, and terminals for electrically connecting the piezoelectric resonators 3 and 4, such as an input terminal 5, an output terminal 6, a ground terminal 7, and a spring terminal 8. In such a case, the piezoelectric resonator 3 which is connected in series between the input terminal 5 and the output terminal 6, and the piezoelectric resonator 4 which is connected in parallel therebetween form a ladder structure.

As shown in FIGS. 14A and 14B, as is well known, the piezoelectric resonator 3 is provided with vibration electrodes 3a and 3b respectively located on top and bottom major surfaces of the resonator 3, and the piezoelectric resonator 4 is provided with vibration electrodes 4a and 4b respectively located on the top and bottom major surfaces of the resonator 4. The piezoelectric resonators 3 and 4 vibrate in the expansion vibration mode. In the piezoelectric resonators 3 and 4, the center frequency is determined by the side dimension of the device. The lengths of the mutually facing two sides of the piezoelectric resonator 3 and the piezoelectric resonator 4 have the same dimension.

On the other hand, in the ladder-type filter, in order to obtain a predetermined amount of attenuation, the terminal-to-terminal capacitance value of the piezoelectric resonator 3 must be small and the terminal-to-terminal capacitance value of the piezoelectric resonator 4 must be large. For this reason, in such a conventional ladder-type filter 1, the thickness of the piezoelectric resonator 3 must be larger than that of the piezoelectric resonator 4, and further, the electrode dimensions of the electrodes 3a and 3b disposed on the top and bottom major surfaces of the piezoelectric resonator 3 must be smaller than those of the piezoelectric resonator 4.

In the ladder-type filter 1, a folding process is performed on the lead terminal 6, which functions as an output terminal, such that the terminal 6 is folded back onto itself. The output terminal 6 includes an unbent portion 6a, a bent portion 6b and an external connection portion 6c, which serve as electrode chip portions. The unbent portion 6a is provided with a projection 6d, and the bending portion 6b is provided with a projection 6e. In the output terminal 6, the projection 6d is disposed in pressure-contact with a first major surface of the piezoelectric resonator 3, and the projection 6e is disposed in pressure-contact with a first major surface of the piezoelectric resonator 4.

The input terminal 5 includes an electrode chip portion 5a, an external connection portion 5b, and a projection 5c, with the projection 5c being disposed in pressure-contact with a second major surface of the piezoelectric resonator 3. The ground terminal 7 includes an electrode chip portion 7a, an external connection portion 7b, and a projection 7c, with the projection 7c being disposed in pressure-contact with a second main side of the piezoelectric resonator 4.

The piezoelectric resonator 3, the piezoelectric resonator 4, the input terminal 5, the output terminal 6, and the ground terminal 7 are housed inside the case 2. Further, the spring terminal 8 is arranged between the inner wall of the case 2 and the input terminal 5, with the result being that the piezoelectric resonator 3, the piezoelectric resonator 4, the input terminal 5, the output terminal 6, and the ground terminal 7 are supported in the case 2 with an appropriate pressure-contact force. Then, insulating paper 9a is provided in a portion of an opening 2a of the case 2, after which the opening 2a of the case 2 is filled with a sealing resin 9b, such as a heat-curing resin.

However, in the above-described conventional ladder-type filter 1, since the piezoelectric resonator 3 and the piezoelectric resonator 4 are electrically connected to each other by the input terminal 5, the output terminal 6, the ground terminal 7 and the like, that is, in this ladder-type filter 1, by mechanically holding the piezoelectric resonator 3 and the piezoelectric resonator 4 via the respective terminals 5, 6, 7 and 8, the piezoelectric resonator 3 and the piezoelectric resonator 4 are resiliently held inside the case 2.

Therefore, the height of the product is relatively large, thereby preventing formation of the ladder-type filter to have a small size.

In recent years, there has been a demand for the ladder-type filter to be formed as a chip, and for the height of a product including the ladder-type filter to become increasingly smaller or miniaturized. Further, in the conventional ladder-type filter 1, since all of the terminals described above are required, the number of parts is increased, and manufacturing steps are complex. Therefore, manufacturing costs are high.

SUMMARY OF THE INVENTION

To overcome the problems of the prior art, the preferred embodiments of the present invention provide a ladder-type filter which can be assembled at a low cost and to have a small size.

To this end, according to a first preferred embodiment of the present invention, there is provided a ladder-type filter comprising:

a first resonator including a first substantially rectangular piezoelectric substrate having a first upper major surface and a first lower major surface and a plurality of first side surfaces extending between the first upper major surface and said first lower major surface, a first electrode disposed on a first of the first side surfaces of the first piezoelectric substrate, a second electrode disposed on a second of said first side surfaces of the first piezoelectric substrate, a second resonator including a second substantially rectangular piezoelectric substrate having a second upper major surface and a second lower major surface and a plurality of second side surfaces extending between the second upper major surface and the second lower major surface, a third electrode disposed on the second upper major surface, and a fourth electrode disposed on the second major lower surface of the second piezoelectric substrate, wherein the first and second resonators are stacked on each other and arranged such that the third electrode disposed on the second upper major surface of the second piezoelectric substrate faces the first lower major surface of the first resonator and the first electrode disposed on the first of the first side surfaces of the first piezoelectric substrate is mechanically and electrically connected to the third electrode.

According to a second preferred embodiment of the present invention, there is provided a ladder-type filter comprising: a first resonator including a first substantially rectangular piezoelectric substrate having a first upper major surface and a first lower major surface and a plurality of first side surfaces extending between the first upper major surface and the first lower major surface, a first electrode disposed on a first of the first side surfaces of the first piezoelectric substrate, a second electrode disposed on a second of the first side surfaces of the first piezoelectric substrate, a second resonator including a second substantially rectangular piezoelectric substrate having a second upper major surface and a second lower major surface and a plurality of second side surfaces extending between the second upper major surface and the second lower major surface, a third electrode disposed on the second upper major surface, a fourth electrode disposed on the second major lower surface of the second piezoelectric substrate, a third resonator including a third substantially rectangular piezoelectric substrate having a third upper major surface and a third lower major surface and a plurality of third side surfaces extending between the third upper major surface and the third lower major surface, a fifth electrode disposed on a first of the third side surfaces of the third piezoelectric substrate, a sixth electrode disposed on a second of the third side surfaces of the first piezoelectric substrate, a fourth resonator including a fourth substantially rectangular piezoelectric substrate having a fourth upper major surface and a fourth lower major surface and a plurality of fourth side surfaces extending between the fourth upper major surface and the fourth lower major surface, a seventh electrode disposed on the fourth upper major surface, and an eighth electrode disposed on the fourth major lower surface of the second piezoelectric substrate; wherein the first, second, third and fourth resonators are stacked on each other and arranged such that the third electrode disposed on the second upper major surface of the second piezoelectric substrate faces the first lower major surface of the first resonator and the first electrode disposed on the first of the first side surfaces of the first piezoelectric substrate is mechanically and electrically connected to the third electrode, the third and fourth resonators are arranged such that the seventh electrode disposed on the fourth upper major surface of the fourth piezoelectric substrate faces the third lower major surface of the third piezoelectric substrate and the fifth electrode disposed on the first of the third side surfaces of the third piezoelectric substrate is mechanically and electrically connected to the seventh electrode.

According to a third preferred embodiment of the present invention, there is provided a ladder-type filter comprising:
a first resonator group including a first resonator having a first substantially rectangular piezoelectric substrate having a first upper major surface and a first lower major surface and a plurality of first side surfaces extending between the first upper major surface and the first lower major surface, a first electrode disposed on a first of the first side surfaces of the first piezoelectric substrate and a second electrode disposed on a second of the first side surfaces of the first piezoelectric substrate, a second resonator including a second substantially rectangular piezoelectric substrate having a second upper major surface and a second lower major surface and a plurality of second side surfaces extending between the second upper major surface and the second lower major surface, a third electrode disposed on the upper major surface, a fourth electrode disposed on the second major lower surface of the second piezoelectric substrate, the first and second resonators being stacked on each other, a second resonator group including a third resonator including a third substantially rectangular piezoelectric substrate having a third upper major surface and a third lower major surface and a plurality of third side surfaces extending between the third upper major surface and the third lower major surface, a fifth electrode disposed on a first of the third side surfaces of the third piezoelectric substrate, a sixth electrode disposed on a second of said third side surfaces of the first piezoelectric substrate, a fourth resonator including a fourth substantially rectangular piezoelectric substrate having a fourth upper major surface and a fourth lower major surface and a plurality of fourth side surfaces extending between the fourth upper major surface and the fourth lower major surface, a seventh electrode disposed on the fourth upper major surface, an eighth electrode disposed on the fourth major lower surface of the second piezoelectric substrate, the third and fourth resonators being stacked on each other, wherein the first and second resonator groups are spaced apart from each other, the fourth electrode disposed on the second lower major surface of the second piezoelectric substrate faces the first upper major surface of the first piezoelectric substrate and the first electrode disposed on the first of the first side surfaces of the first piezoelectric substrate is mechanically and electrically connected to the third electrode, said third and fourth resonators are arranged such that the eighth electrode disposed on the fourth lower major surface of the fourth piezoelectric substrate faces the third upper major surface of the third piezoelectric substrate and the fifth electrode disposed on the first of the third side surfaces of the third piezoelectric substrate is mechanically and electrically connected to the seventh electrode, the first electrode disposed on the first of the first side surfaces of the first piezoelectric substrate and the sixth electrode disposed on the second of the third side surfaces of the third piezoelectric substrate are mechanically and electrically connected to each other, and the third electrode disposed on the second major upper surface of the second piezoelectric substrate and the seventh electrode disposed on the fourth major upper surface of the fourth piezoelectric substrate are mechanically and electrically connected to each other.

According to a fourth preferred embodiment of the present invention, there is provided a ladder-type filter comprising:
a first resonator including a first substantially rectangular piezoelectric substrate having a first upper major surface and a first lower major surface and a plurality of first side surfaces extending between the first upper major surface and the first lower major surface, a first electrode disposed on a first of the first side surfaces of the first piezoelectric substrate, a second electrode disposed on a second of the first side surfaces of the first piezoelectric substrate, a second resonator including a second substantially rectangular piezoelectric substrate having a second upper major surface and a second lower major surface and a plurality of second side surfaces extending between the second upper major surface and the second lower major surface, a third electrode disposed on the second upper major surface of the piezoelectric substrate, a fourth electrode disposed on the second major lower surface of the second piezoelectric substrate, a third resonator including a third substantially rectangular piezoelectric substrate having a third upper major surface and a third lower major surface and a plurality of third side surfaces extending between the third upper major surface and the third lower major surface, a fifth electrode disposed on a first of the third side surfaces of the third piezoelectric substrate, a sixth electrode disposed on a second of the third side surfaces of the first piezoelectric substrate, and a fourth resonator including a fourth substantially rectangular piezoelectric substrate having a fourth upper major surface and a fourth lower major surface and a plurality of fourth side surfaces extending between the fourth upper major surface and the fourth lower major surface, a seventh electrode disposed on the fourth upper major surface of the fourth piezoelectric substrate, and an eighth electrode disposed on the fourth major lower surface of the second piezoelectric substrate, wherein a resonator group is defined in which the second resonator and the fourth resonator are spaced apart from each other, the third resonator is stacked on the second and the fourth resonators so as to extend between the second and the fourth resonators, and the first resonator is stacked on the second resonator such that the first resonator is spaced from the third resonator.

According to a fifth preferred embodiment of the present invention, the electrical and mechanical connection between the various resonators and electrodes in the ladder type filter are preferably achieved using a conductive bonding material. According to a sixth preferred embodiment of the present invention, there is provided a ladder-type filter as described above, wherein the resonator group is supported by a support substrate. According to a seventh preferred embodiment of the present invention, there is provided a ladder-type filter as described above, wherein a buffer member is disposed between the resonator group and the support substrate.

In at least one preferred embodiment of the present invention, a resonator group includes stacked first and second resonators which are mechanically connected in layers and the first and second resonators are electrically connected in the form of a ladder.

In another preferred embodiment of the present invention, a resonator group includes stacked first, second, third and fourth resonators which are mechanically connected in layers and the respective resonators are electrically connected in the form of a ladder.

In a further preferred embodiment of the present invention, a resonator group includes a first resonator group having stacked first and second resonators which are mechanically connected in layers, and a second resonator group having stacked third and fourth resonators which are mechanically connected in layers, and the respective resonators of the first and second resonator groups are electrically connected in the form of a ladder.

In an additional preferred embodiment of the present invention, second and third resonators are spaced apart from each other, a fourth resonator is stacked so as to extend between the second and third resonators, a first resonator is stacked on the second resonator so as to define a spacing therebetween and the first and fourth resonators are mechanically connected so as to form layers, and a resonator group is defined in which the respective first, second third and fourth resonators are electrically connected in the form of a ladder.

In another preferred embodiment of the present invention, a conductive bonding material functions as a connection member for mechanically connecting a plurality of resonators in layers and electrically connecting the plurality of resonators in the form of a ladder.

In another preferred embodiment of the present invention, a ladder type filter includes a support substrate which supports a resonator group at a predetermined position.

In a further preferred embodiment of the present invention, a ladder type filter includes a buffer material arranged to absorb an impact force applied to a resonator group when the external impact is applied to the ladder type filter. According to the preferred embodiments of the present invention, a ladder-type filter and a method of manufacturing the same is provided which yields a low cost and reduced size component. Further, according to one preferred embodiment of the present invention, even if, for example, an external impact is applied to the ladder-type filter, since the impact force can be absorbed by the buffer member, it is possible to prevent the resonator group from being damaged.

The above and further advantages, aspects and novel features of the preferred embodiments of the present invention will become more apparent from the following detailed description when read in connection with the accompanying drawings.

BRIEF DESCRIPTION OF THE DRAWINGS

FIG. 4 is a plan view illustrating a support substrate mounted in the ladder-type filter shown in FIGS. 2 and 3A and 3B;

FIGS. 8A and 8B are a partial sectional view and a plan view, respectively, illustrating still another preferred embodiment of the present invention;

DETAILED DESCRIPTION OF PREFERRED EMBODIMENTS

Figure 1A:
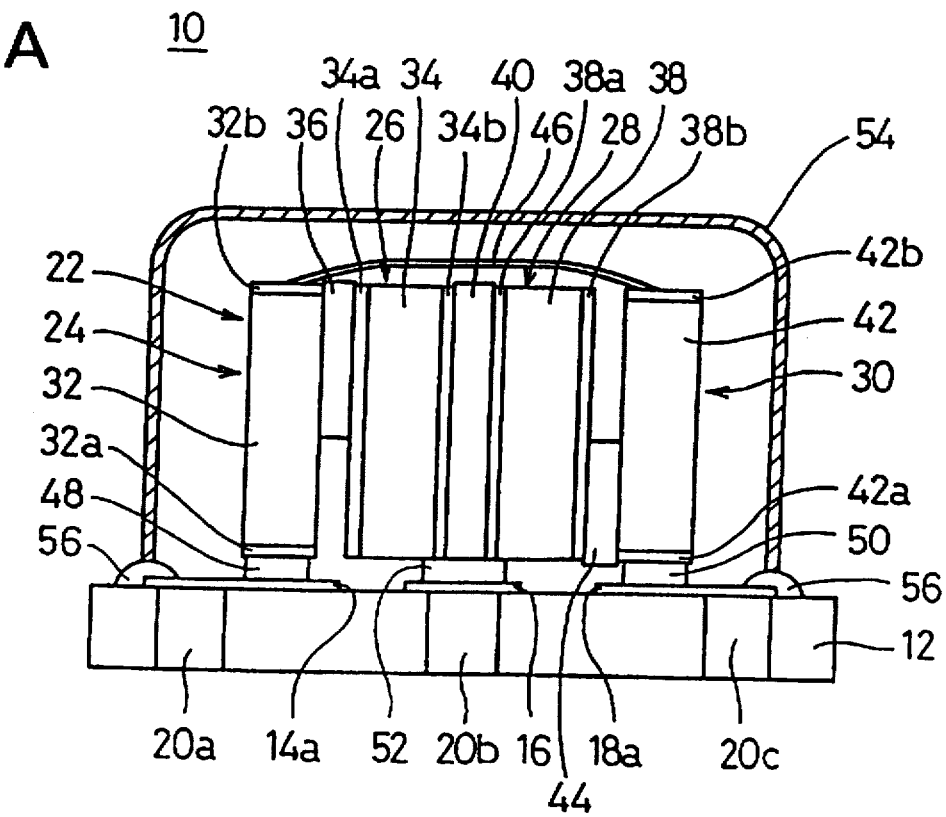
FIG. 1A is a partial sectional view illustrating a preferred embodiment of the present invention.

It should be noted that in the following description of preferred embodiments of the present invention, like reference numerals indicate like elements to avoid repetitive description of common elements included in each preferred embodiment.

Figure 1B:
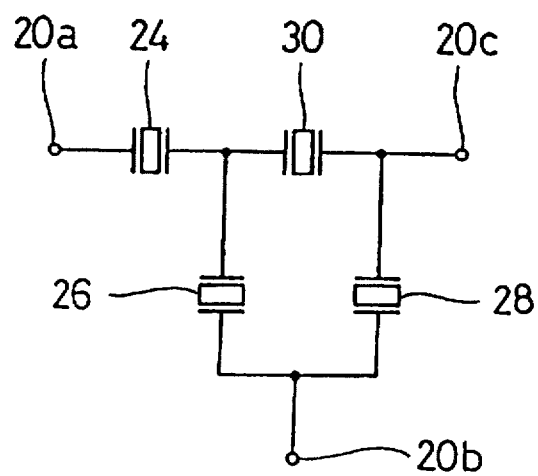
FIG. 1B is an electrical equivalent circuit diagram of the preferred embodiment shown in FIG. 1A.

FIG. 1A is a front view illustrating a preferred embodiment of the present invention. FIG. 1B is an electrical equivalent circuit diagram of the preferred embodiment shown in FIG. 1A.

A ladder-type filter 10 according to this preferred embodiment includes, for example, an alumina substrate 12 which, in plan view, has a substantially rectangular shape and which functions as a support substrate. The alumina substrate 12, as shown in FIG. 4, includes three line electrodes 14, 16 and 18 located on the surface thereof. The line electrodes 14, 16 and 18 are arranged so as to be spaced apart from each other along the width of the alumina substrate 12 and so as to extend from one end of the alumina substrate 12 to the other end along the length thereof. Included in the line electrode 14 is an extension electrode 14a in the shape of a strip which extends from the center portion of the line electrode 14 along the length of the line electrode 14 toward the center portion along the width of the alumina substrate 12. Similarly, included in the line electrode 18 is an extension electrode 18a in the shape of a strip which extends from the center portion of the line electrode 18 along the length of the line electrode 18 and extends toward the center portion of the alumina substrate along the width of the alumina substrate 12. The line electrodes 14, 16 and 18, and the extension electrodes 14a and 18a are preferably formed by printing a conductor paste of copper, silver, aluminum or the like to have a desired film thickness.

Further, external electrodes 20a, 20b and 20c are disposed on the side edge surface at one end of the alumina substrate 12, and external electrodes 20d, 20e and 20f are disposed on the side edge surface at the other end of the alumina substrate 12. The external electrode 20a is connected to one end of the line electrode 14 and functions as an input terminal. The external electrode 20b is connected to one end of the line electrode 16 and functions as a ground terminal. The external electrode 20c is connected to one end of the line electrode 18 and functions as an output terminal. The external electrodes 20d, 20e and 20f are connected to the other ends of the line electrodes 14, 16 and 18, respectively, and function as dummy electrodes.

A resonator group 22 (see FIG. 2) is disposed on the alumina substrate 12.

Figure 2:
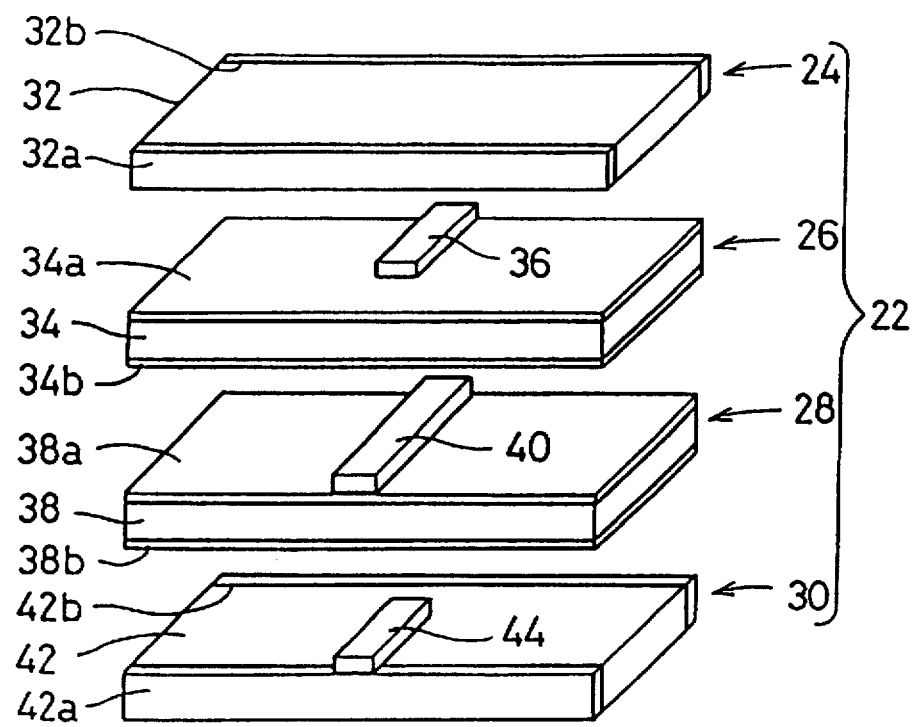
FIG. 2 is an exploded view illustrating the essential portion of a method of manufacturing a resonator group for use in the ladder-type filter of FIGS. 1A and 1B.
Figure 3A:
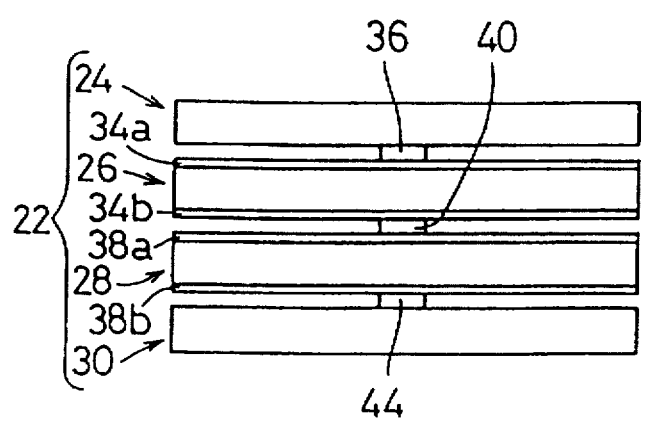
FIGS. 3A and 3B are illustrations showing stacked resonator groups.
Figure 3B:
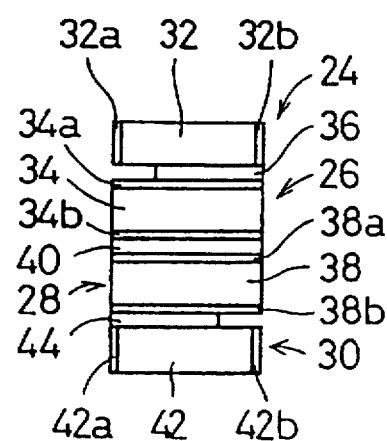

The resonator group 22 includes a first piezoelectric resonator 24, a second piezoelectric resonator 26, a third piezoelectric resonator 28, and a fourth piezoelectric resonator 30. The first piezoelectric resonator 24, as shown in FIG. 2, includes a first piezoelectric substrate 32 preferably made of piezoelectric ceramic and to have a substantially rectangular shape. In the first piezoelectric substrate 32, a vibration electrode 32a is located on the surface of one side edge of and extending along the length of the first piezoelectric substrate 32, and a vibration electrode 32b is disposed on the surface of the other side edge of and extending along the length of the first piezoelectric substrate 32. The vibration electrodes 32a, 32b preferably vibrate in the longitudinal vibration mode. However, the vibration electrodes may be adapted to vibrate in other vibration modes.

A second piezoelectric resonator 26 is disposed below the first piezoelectric resonator 24 so that the bottom major surface of the first piezoelectric resonator 24 faces the top major surface of the second piezoelectric resonator 26.

The second piezoelectric resonator 26 includes a second piezoelectric substrate 34 having substantially the same peripheral shape as that of the first piezoelectric substrate 32. The second piezoelectric substrate 34 has a vibration electrode 34a disposed on the entire top major surface thereof and has a vibration electrode 34b disposed on the entire bottom major surface thereof. The vibration electrodes 34a, 34b preferably vibrate in the longitudinal vibration mode although other vibration modes may be used. Further, disposed on the top major surface of the second piezoelectric substrate 34 is a first connection member 36 having a predetermined length and being located near the central portion of the length of the second piezoelectric substrate 34 and extending to one edge portion of the second piezoelectric substrate 34. A third resonator 28 is disposed below the second piezoelectric resonator 26 so that the vibration electrode 34b faces the top major surface of the third piezoelectric resonator 28.

Similarly to that described above, the third piezoelectric resonator 28 preferably has substantially the same construction as that of the second piezoelectric resonator 26. That is, the third piezoelectric resonator 28 includes a third piezoelectric substrate 38 having substantially the same peripheral shape as that of the second piezoelectric substrate 34. The third piezoelectric substrate 38 has a vibration electrode 38a disposed on the entire top major surface thereof and has a vibration electrode 38b disposed on the entire bottom major surface thereof. The vibration electrodes 38a and 38b preferably vibrate in the longitudinal vibration mode although other vibration modes may be used. Further, a second connection member 40 is preferably disposed on the surface of the third piezoelectric substrate 38 in the central portion of the length of the third piezoelectric substrate 38 and extends from one end to the other end of the substrate 38 so as to span the width of the third piezoelectric substrate 38. A fourth piezoelectric resonator 30 is disposed below the third piezoelectric resonator 28 so that the vibration electrode 38b faces the top major surface of the fourth piezoelectric resonator 30.

The fourth piezoelectric resonator 30 preferably has substantially the same construction as that of the first piezoelectric resonator 24. That is, the fourth piezoelectric resonator 30 includes a fourth piezoelectric substrate 42 having substantially the same peripheral shape as that of the first piezoelectric substrate 32. The fourth piezoelectric substrate 42 has a vibration electrode 42a disposed at the edge surface of one side of the fourth piezoelectric substrate 42 extending along the length of the fourth piezoelectric substrate 42 and has a vibration electrode 42b formed on the edge surface of the other side of the fourth piezoelectric substrate 42 extending along the length of the fourth piezoelectric substrate 42. The vibration electrodes 42a and 42b preferably vibrate in the longitudinal vibration mode although other vibration modes may be used. Further, disposed on a surface of the fourth piezoelectric substrate 42 is a connection member 44 having a predetermined length and extending to an edge of one side of the fourth piezoelectric substrate 42 and being located at the central portion located along the length of the fourth piezoelectric substrate 42. The above-mentioned resonators and substrates do not need to have substantially the same peripheral shape.

The above-described first connection member 36, second connection member 40 and third connection member 44 function to achieve both electrical and mechanical connections. The connection members 36, 40, and 44 are preferably formed from, for example, a conductive bonding material having a conductive filler of silver mixed to a heat-curing resin such as silicon or epoxy. When, in particular, a conductive bonding material having a silicon resin as a base is used, vibration leakage is absorbed by the elastic properties of the silicon resin, thereby surely preventing the filter characteristics from being impaired.

In the resonator group 22, the vibration electrode 32b of the first piezoelectric resonator 24 is connected to the vibration electrode 34a of the second piezoelectric resonator 26 via the first connection member 36. The vibration electrode 34b of the second piezoelectric resonator 26 is connected to the vibration electrode 38a of the third piezoelectric resonator 28 via the second connection member 40.

Further, the vibration electrode 38b of the third piezoelectric resonator 28 is connected to the vibration electrode 42a of the fourth piezoelectric resonator 30 via the third connection member 44.

Furthermore, in the resonator group 22, the vibration electrode 32b of the first piezoelectric resonator 24 is connected to the vibration electrode 42b of the fourth piezoelectric resonator 30 by, for example, a metallic wire 46 (see FIG. 1A).

The resonator group 22 can be mounted and secured onto the surface of the alumina substrate 12 by bonding with what is commonly called conductive bonding agents 48, 50 and 52 (see FIG. 4) preferably having a filler of a conductive material such as silver mixed into a heat-curing resin of silicon, epoxy or the like. In such a case, the vibration electrode 32a of the first piezoelectric resonator 24 is connected to the extension electrode 14a via the conductive bonding agent 48. The vibration electrode 42a of the fourth piezoelectric resonator 30 is connected to the extension electrode 18a via the conductive bonding agent 50. The vibration electrode 34b of the second piezoelectric resonator 26 and the vibration electrode 38a of the third piezoelectric resonator 28 are connected to the extension electrode 16 via the conductive bonding agent 52. In this case also, use of a conductive bonding material having a silicon resin as a base makes it possible to obtain the above-described advantages.

Further, a metallic cap 54 (see FIG. 1A) which is preferably formed in the shape of a U when viewed in cross section is provided on the surface of the alumina substrate 12 in such a manner as to cover the entire resonator group 22, and the cap 54 is preferably fixed onto the alumina substrate 12 by a fixation member 56, such as an insulating bonding agent.

FIG. 1B is an electrical equivalent circuit diagram of the ladder-type filter 10 shown in FIG. 1A. The first piezoelectric resonator 24 and the fourth piezoelectric resonator 30 are connected in series between the external electrode 20a serving as an input terminal and the external electrode 20c serving as an output terminal. Further, the second piezoelectric resonator 26 and the third piezoelectric resonator 28 are connected in parallel between the external electrode 20a and the external electrode 20c. That is, the first piezoelectric resonator 24 and the fourth piezoelectric resonator 30, and the second piezoelectric resonator 26 and the third piezoelectric resonator 28 are connected alternately, thus forming a ladder structure.

A preferred method of manufacturing the ladder-type filter 10 will now be described.

Initially, the first, second, third and fourth piezoelectric resonators 24, 26, 28 and 30 are manufactured. That is, four of the first, second, third and fourth piezoelectric substrates 32, 34, 38 and 42 made of a piezoelectric ceramic in the shape of a substantially rectangular body are prepared.

Then, a conductive material such as a silver paste is printed to a thick film on both side edge surfaces of each of the first piezoelectric substrate 32 and the fourth piezoelectric substrate 42 from one end to the other end of the length, after which the conductive material is fired. As a result, the vibration electrodes 32a and 32b are formed respectively on a first side edge and a second side edge of the first piezoelectric substrate 32 extending along the length thereof. The vibration electrodes 42a and 42b are formed respectively on a first side edge and a second side edge of the fourth piezoelectric substrate 42 along the length thereof.

Further, a conductive material such as a silver paste is printed to a thick film on the top and bottom major surfaces of the second piezoelectric substrate 34 and the third piezoelectric substrate 38, and then fired. As a result, the vibration electrodes 34a and 34b are formed respectively on the top and bottom major surfaces of the second piezoelectric substrate 34. The vibration electrodes 38a and 38b are formed respectively on the top and bottom major surfaces of the third piezoelectric substrate 38. As a method of forming each of the vibration electrodes 32a and 32b, 42a and 42b, 34a and 34b, and 38a and 38b, in place of the above-described printing and firing method, a sputtering and vapor deposition method may be used to form NiCr, NiCu, Ag or the like to a thin film. Alternatively, other suitable electrode forming methods may be used.

In the above-described way, the first, second, third and fourth piezoelectric resonators 24, 26, 28 and 30 are manufactured.

Next, as shown in FIG. 2, a conductive bonding material is preferably applied onto the surfaces of each of the second piezoelectric resonator 26, the third piezoelectric resonator 28 and the fourth piezoelectric resonator 30 so as to define connection members preferably located at the center portion along the length thereof. In this preferred embodiment, a conductive bonding agent formed from a heat-curing bonding agent of silicon, epoxy or the like having a filler of a conductive material of Ag or the like mixed therein is deposited on the resonators by a method, such as print or transfer processes.

Then, the first, second, third and fourth piezoelectric resonators 24, 26, 28 and 30 are stacked in sequence on one another as shown in FIG. 2, with the result being that the piezoelectric resonators 24, 26, 28 and 30 are bonded together to form layers. Then, in the first, second, third and fourth piezoelectric resonators 24, 26, 28 and 30, after a passage of a predetermined time, the conductive bonding agents which form the first, second and third connection members 36, 40 and 44 are cured, and thus the resonator group 22 is formed.

At such a time, the first connection member 36 is formed at a predetermined position between the first piezoelectric resonator 24 and the second piezoelectric resonator 26. The second connection member 40 is formed at a predetermined position between the second piezoelectric resonator 26 and the third piezoelectric resonator 28. The third connection member 44 is formed at a predetermined position between the third piezoelectric resonator 28 and the fourth piezoelectric resonator 30.

Furthermore, the vibration electrode 32b of the first piezoelectric resonator 24 is connected to the vibration electrode 42b of the fourth piezoelectric resonator 30 by, for example, the metallic wire 46.

Thereafter, the resonator group 22 is bonded onto the alumina substrate 12. That is, the vibration electrode 32a of the first piezoelectric resonator 24 and the extension electrode 14a are bonded to each other via the conductive bonding agent 48 having a filler of a conductive material of silver or the like mixed in a heat-curing resin of silicon, epoxy or the like. Similarly, the vibration electrode 42a of the fourth piezoelectric resonator 30 and the extension electrode 18a are bonded to each other via the conductive bonding agent 50. The vibration electrode 34a of the second piezoelectric resonator 26 and the vibration electrode 38a of the third piezoelectric resonator 28 are bonded to the extension electrode 16 via the conductive bonding agent 52.

Then, the metallic cap 54 is mounted on the surface of the alumina substrate 12 in such a manner as to cover the entire alumina substrate 12, and the lower end portion of the metallic cap 54 is fixed by fixation member 56 such as an insulating bonding agent.

Figure 13:
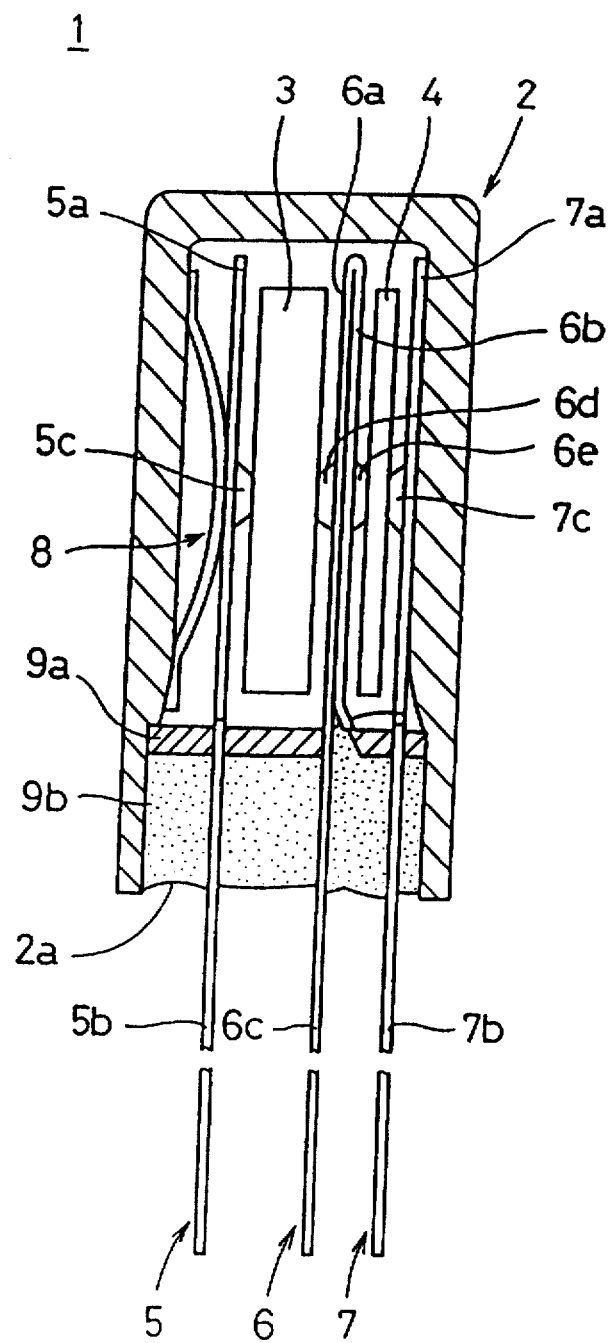
FIG. 13 is a partial sectional view illustrating an example of a conventional ladder-type filter which forms the background of the present invention.
Figure 14A:
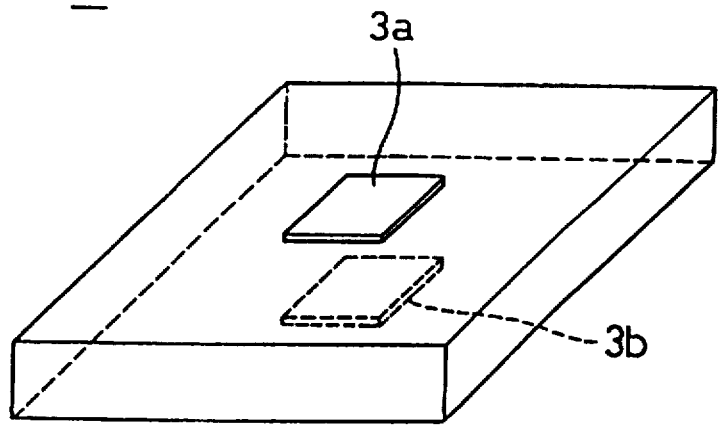
FIGS. 14A and 14B are perspective views illustrating an example of a resonator group for use in the ladder-type filter of FIG. 13.
Figure 14B:
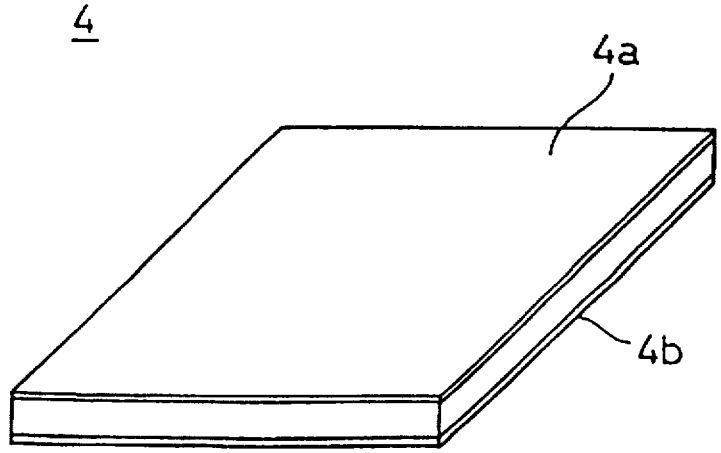

In the ladder-type filter 10 of the preferred embodiment shown in FIGS. 1A and 1B to FIG. 4, the first, second, third and fourth piezoelectric resonators 24, 26, 28 and 30 which define the resonator group 22 are electrically connected by the first, second and third connection members 36, 40 and 44 preferably formed from a conductive bonding agent. Therefore, a lower height is possible in comparison with the conventional ladder-type filter 1 in which a plurality of resonators are electrically and mechanically connected by metallic terminals having projections as shown in FIGS. 13 and FIGS. 14A and 14B. Thus, it is possible to form the product with a substantially reduced size.

Furthermore, since, unlike the prior art, metallic terminals having projections are not required, the number of parts decreases by an amount corresponding to a decrease in the number of the metallic terminals. Therefore, in the ladder-type filter 10 of this preferred embodiment, the assembly process is simplified and performed more quickly and economically as compared to the prior art, and therefore, manufacturing costs are reduced. Also, because of the location of the electrodes 32a, 32b, 42a, 42b on the side edge surfaces of the piezoelectric substrates 32 and 42, respectively, sufficient terminal to terminal capacitance is achieved and thus, there is no need for the substrates 32 and 42 to have greater thickness than substrates 26 and 28.

Figure 5:
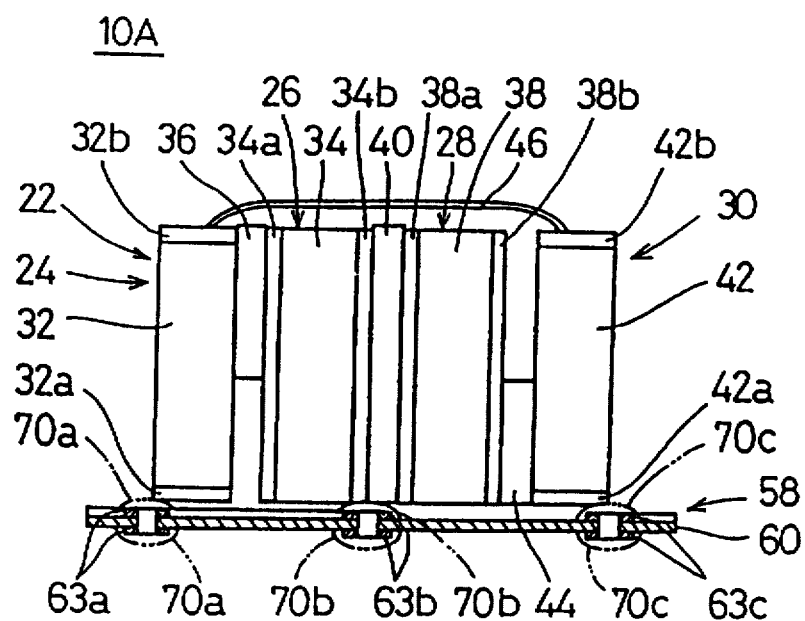
FIG. 5 is a partial sectional view illustrating another preferred embodiment of the present invention.

FIG. 5 is a front view illustrating the essential portion of another preferred embodiment of the present invention. The difference of a ladder-type filter 10A of the preferred embodiment shown in FIG. 5 from the ladder-type filter 10 of the preferred embodiment shown in FIGS. 1A and 1B to FIG. 4 is that a buffer member 58 is disposed between the alumina substrate 12 and the resonator group 22.

Figure 6:
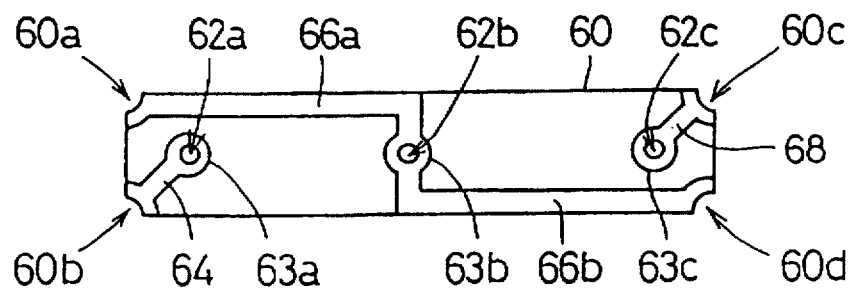
FIG. 6 is a plan view illustrating a buffer substrate by itself which is used in the apparatus according to the preferred embodiment shown in FIG. 5.

The buffer member 58 preferably includes a buffer substrate 60 in the shape of a substantially rectangular plate which is preferably formed from a synthetic resin material of an epoxy resin containing glass fibers, a phenol resin or the like. The buffer substrate 60 includes cutout portions 60a, 60b, 60c and 60d (see FIG. 6) preferably located at the four corners of the substrate 60. The buffer substrate 60 is further provided with, for example, three through holes 62a, 62b and 62c located at the center portion of the I width of the buffer substrate 60 and in such a manner as to be spaced apart from each other along the length of the buffer substrate 60. The opening edge portions of the through holes 62a, 62b and 62c are formed respectively with electrodes 63a, 63b and 63c. Further, line electrodes 64, 66a, 66b and 68 are disposed on the surface of the buffer substrate 60. The electrodes 63a, 63b and 63c and the line electrodes 64, 66a, 66b and 68 are preferably formed by depositing a copper foil or the like.

The line electrode 64 preferably extends from the cutout portion 60b to the electrode 63a formed in the opening edge portion of the through hole 62a. The line electrode 66a preferably extends along the edge of one side of the buffer substrate 60 from the cutout portion 60a to the electrode 63b formed in the opening edge portion of the through hole 62b. Similarly, the line electrode 66b preferably extends along the edge of the other side of the buffer substrate 60 from the electrode 63b to the cutout portion 60d. The line electrode 68 preferably extends from the cutout portion 60c to the electrode 63c formed in the opening edge portion of the through hole 62c.

The resonator group 22 is preferably electrically and mechanically connected onto the surface of the buffer member 58 by connection members 70a, 70b and 70c, preferably formed of solder or a conductive bonding agent. In such a case, the vibration electrode 32a of the first piezoelectric resonator 24 is connected to the electrode 63a at the edge portion of the through hole 62a via the bonding member 70a. Similarly, the vibration electrode 34b of the second piezoelectric resonator 26 and the vibration electrode 38a of the third piezoelectric resonator 28 are connected to the electrode 63b at the edge portion of the through hole 62b via the bonding member 70b. The vibration electrode 42a of the fourth piezoelectric resonator 30 is connected to the electrode 63c at the edge portion of the through hole 62c via the bonding member 70c.

Further, in this state, the alumina substrate 12 is electrically and mechanically connected onto the reverse or bottom surface of the buffer member 58 by fixation members 72a, 72b, 72c and 72d (see FIG. 7), such as, solder members. In this case, a difference between the preferred embodiment shown in FIGS. 5 and 6 and the preferred embodiment shown in FIGS. 1A and 1B to FIG. 4 is the arrangement of line electrodes disposed on the surface of the alumina substrate 12A.

Figure 7:
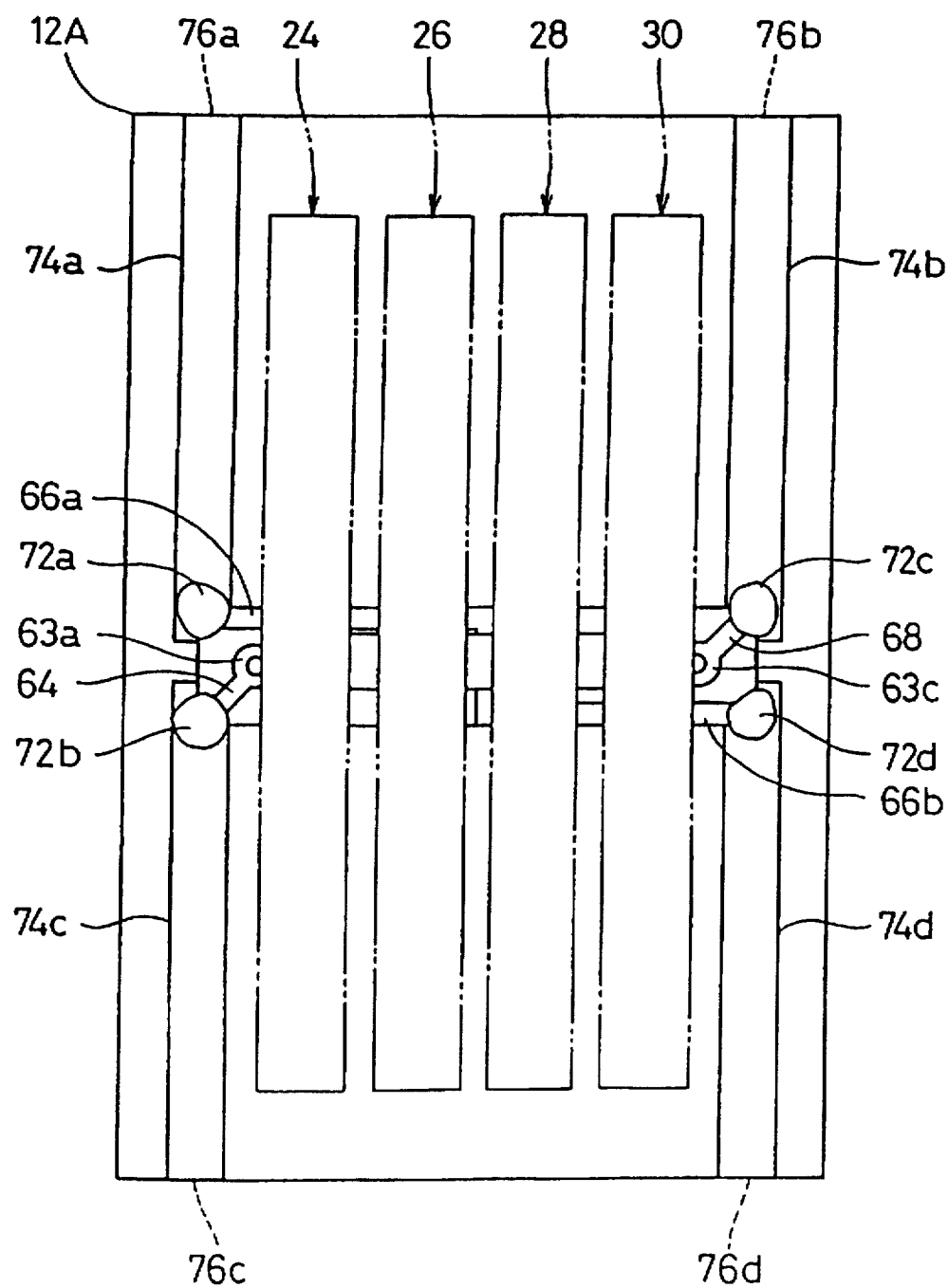
FIG. 7 is a plan view illustrating the buffer substrate, line electrodes and piezoelectric resonators according to the preferred embodiment shown in FIG. 5.

In this preferred embodiment, as shown in FIG. 7, line electrodes 74a and 74b are arranged so as to extend from one end of the length of the alumina substrate 12A to the central portion of the alumina substrate 12A, and line electrodes 74c and 74d are arranged so as to extend from the other end of the length of the alumina substrate 12A to the central portion thereof. The line electrodes 74a and 74b are arranged so as to be spaced apart from each other at a common end portion along the length of the alumina substrate 12A, and the line electrodes 74c and 74d are arranged so as to be spaced apart from each other at a common end portion along the length of the alumina substrate 12A.

Further, external electrodes 76a and 76b and external electrodes 76c and 76d are disposed respectively on the end surfaces of one end and the other end of the length of the alumina substrate 12A. The external electrode 76a is connected to one end of the line electrode 74a and functions as a ground terminal. The external electrode 76b is connected to one end of the line electrode 74b and functions as an output terminal. The external electrode 76c is connected to one end of the line electrode 74c and functions as an input terminal. The external electrode 76d is connected to one end of the line electrode 74d and functions as a ground terminal.

The other end portion of the line electrode 74a on the alumina substrate 12A is connected to one end portion of the line electrode 66a on the buffer substrate 60 via the fixation member 72a.

Similarly, the other end portion of the line electrode 74b is connected to one end portion of the line electrode 68 via the fixation member 72c. The other end portion of the line electrode 74c is connected to one end portion of the line electrode 64 via the fixation member 72b. The other end portion of the line electrode 74d is connected to one end portion of the line electrode 66b via the fixation member 72d.

Furthermore, similar to the preferred embodiment shown in FIGS. 1A and 1B to FIG. 4, the metallic cap 54 (not shown) is mounted on the alumina substrate 12A in such a manner as to cover the entire resonator group 22.

In a ladder-type filter 10A of this preferred embodiment, even if a strong external impact is supplied thereto, since the buffer member 58 is provided between the resonator group 22 and the alumina substrate 12A, the impact force is absorbed instead of being directly transmitted to the resonator group 22. Therefore, it is possible to absorb the impact force, thereby preventing the resonator group 22 from being damaged.

It is not always necessary to provide a through hole on the substrate 60, and a predetermined conductive pattern may be formed only on the surface of the substrate.

FIGS. 8A and 8B are a partial sectional view and a plan view, respectively, illustrating still another preferred embodiment of the present invention. A particular difference between a ladder-type filter 10B of the preferred embodiment shown in FIG. 8A from the ladder-type filter 10 of the preferred embodiment shown in FIGS. 1A and 1B to FIG. 4 is the arrangement of the resonator group 22 on the alumina substrate. Although in the ladder-type filter 10 of the preferred embodiment shown in FIGS. 1A and 1B to FIG. 4, one layered structure is formed by the combination of all four of the piezoelectric resonators 24, 26, 28 and 30, in the ladder-type filter 10B of the preferred embodiment shown in FIG. 8A, one layered structure is defined by both the first piezoelectric resonator 24 and the second piezoelectric resonator 26, and further, another layered structure is defined by both the third piezoelectric resonator 28 and the fourth piezoelectric resonator 30.

More specifically, in the ladder-type filter 10B of this preferred embodiment, the first piezoelectric resonator 24 and the second piezoelectric resonator 26 are bonded to each other by the connection members 78 preferably made from a conductive bonding agent and define a layered arrangement. Similarly, the third piezoelectric resonator 28 and the fourth piezoelectric resonator 30 are bonded to each other by the connection member 80 and define a layered arrangement. In such a case, the vibration electrode 32b of the first piezoelectric resonator 24 and the vibration electrode 34b of the second piezoelectric resonator 26 are bonded to each other by the connection member 78, and the vibration electrode 42b of the fourth piezoelectric resonator 30 and the vibration electrode 38b of the third piezoelectric resonator 28 are bonded to each other by the connection member 80.

Then, the first piezoelectric resonator 24 and the second piezoelectric resonator 26 which are arranged in a layered configuration, and the fourth piezoelectric resonator 30 and the third piezoelectric resonator 28 which are arranged in a layered configuration are mounted on the alumina substrate 12B. In this case, a difference between the preferred embodiment shown in FIG. 8 and the preferred embodiment shown in FIGS. 1A and 1B to FIG. 4 is the arrangement of the line electrodes disposed on the surface of the alumina substrate.

That is, in this preferred embodiment, as shown in FIG. 8B, a line electrode 82 is disposed at one end of the length of the alumina substrate 12B and extends from one end to the other end of the substrate 12B so as to span the width of the alumina substrate 12B. A line electrode 84 is disposed at the other end of the alumina substrate 12B along the length thereof and extends from one end to the other end thereof so as to span the width thereof. Further, line electrodes 86a and 86b are disposed at opposite edge portions along the length of the alumina substrate 12B in the center portion of the length of the alumina substrate 12B.

External electrodes 88a, 88b and 88c and external electrodes 88d, 88e and 88f are disposed on the side end surfaces respectively at one end and the other end of the alumina substrate 12B along the width thereof. The external electrode 88a is connected to one end of the line electrode 82 and functions as an input terminal. The external electrode 88b is connected to one end of the line electrode 86a and functions as a ground terminal. The external electrode 88c is connected to one end of the line electrode 84 and functions as an output terminal. The external electrode 88d is connected to one end of the line electrode 86b and functions as a ground terminal. The external electrodes 88e and 88f are connected to the other ends of the line electrodes 82 and 84 respectively and function as dummy electrodes.

Then, the first piezoelectric resonator 24 and the second piezoelectric resonator 26 which are arranged in a layered configuration, and the fourth piezoelectric resonator 30 and the third piezoelectric resonator 28 which are arranged in a layered configuration are connected to each other while being spaced from each other along the alumina substrate 12B preferably via conductive bonding agents 90, 92 and 94.

In such a case, the vibration electrode 32a of the first piezoelectric resonator 24 is connected to the line electrode 82 via the conductive bonding agent 90. The vibration electrode 32b of the first piezoelectric resonator 24 is connected to the vibration electrode 42a of the fourth piezoelectric resonator 30 via the conductive bonding agent 92. The vibration electrode 42b of the fourth piezoelectric resonator 30 is connected to the line electrode 84 via the conductive bonding agent 94.

The vibration electrode 34a of the second piezoelectric resonator 26 and the vibration electrode 38a of the third piezoelectric resonator 28 are connected to the line electrodes 86a and 86b respectively on the alumina substrate 12B via, for example, a line metallic wire 96. In this case, the intermediate portions of the line metallic wire 96 are fixed onto the vibration electrode 34a of the second piezoelectric resonator 26 and the vibration electrode 38a of the third piezoelectric resonator 28 respectively preferably by fixation members 98a and 98b, such as solder members. Then, one end and the other end of the metallic wire 96 are electrically and mechanically fixed respectively to the line electrode 86a and 86b on the alumina substrate 12B preferably by fixation members 100a and 100b.

In the same way as in each of the above-described preferred embodiments, the metallic cap 54 is mounted on the alumina substrate 12B in such a manner as to cover the entire resonator group 22.

Figure 9:
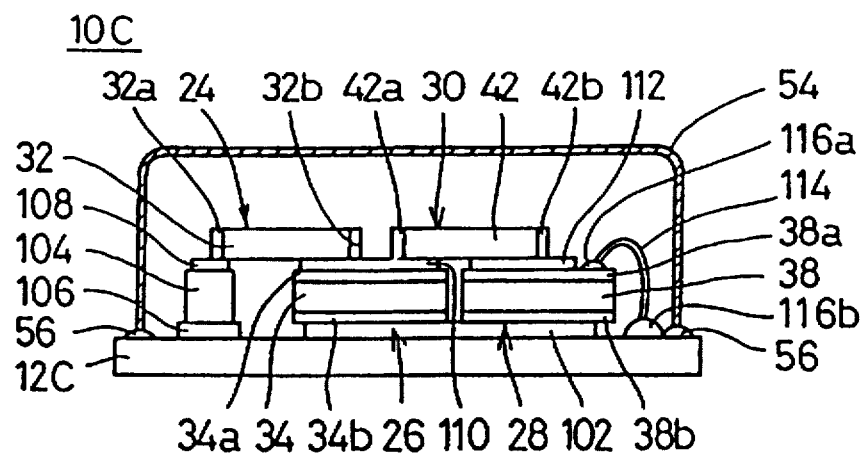
FIG. 9 is a partial sectional view illustrating the essential portion of a further preferred embodiment of the present invention.
Figure 10:
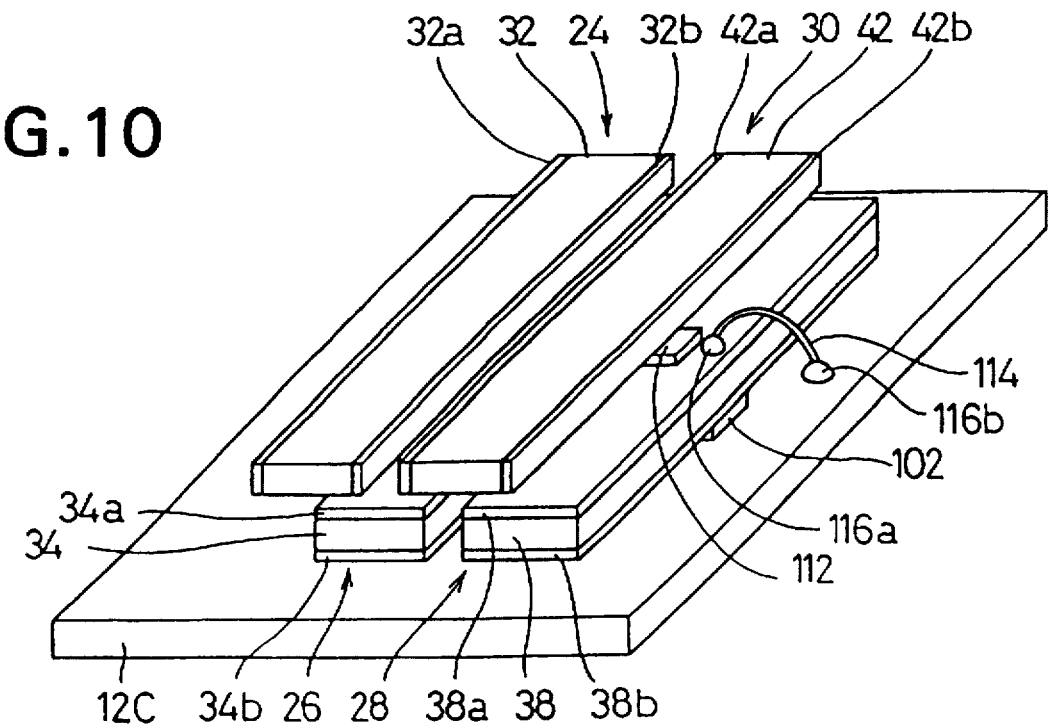
FIG. 10 is a perspective view illustrating the essential portion of the preferred embodiment shown in FIG. 9.

FIG. 9 is a front view illustrating the essential portion of a further preferred embodiment of the present invention. FIG. 10 is a perspective view thereof. A particular difference between a ladder-type filter 10C of the preferred embodiment shown in FIGS. 9 and 10 and the ladder-type filter 10B of the preferred embodiment shown in FIGS. 8A and 8B is the arrangement of the resonator group 22 on the alumina substrate 12. Although in the ladder-type filter 10B of the preferred embodiment shown in FIGS. 8A and 8B, the second piezoelectric resonator 26 and the third piezoelectric resonator 28 which define parallel resonators are arranged on the first piezoelectric resonator 24 and the fourth piezoelectric resonator 30 which define series resonators, in the ladder-type filter 10C of FIGS. 9 and 10, the first piezoelectric resonator 24 and the fourth piezoelectric resonator 30 which define series resonators are arranged on the second piezoelectric resonator 26 and the third piezoelectric resonator 28 which define parallel resonators.

More specifically, the second piezoelectric resonator 26 and the third piezoelectric resonator 28 are bonded onto the alumina substrate 12C with a predetermined spacing along the the alumina substrate 12C by the conductive bonding agent 102. The vibration electrode 34b of the second piezoelectric resonator 26 and the vibration electrode 38b of the third piezoelectric resonator 28 are connected to the ground electrode (not shown) on the alumina substrate 12C via the conductive bonding agent 102. A single metallic block 104 is bonded onto the alumina substrate 12C with a spacing defined between the block 104 and the second piezoelectric resonator 26 by a conductive bonding agent 106. The size of the metallic block 104 is preferably formed, for example, to a length of approximately 1 mm, a width of approximately 0.3 mm and a height of approximately 0.3 mm.

The first piezoelectric resonator 24 and the fourth piezoelectric resonator 30 are bonded to the second piezoelectric resonator 26, the third piezoelectric resonator 28, and the metallic block 104 by conductive bonding agents 108, 110 and 112 in such a manner that first piezoelectric resonator 24 and the fourth piezoelectric resonator 30 extend to the second piezoelectric resonator 26, the third piezoelectric resonator 28, and the metallic block 104. In this case, the vibration electrode 32a of the first piezoelectric resonator 24 is bonded to the upper end surface of the metallic block 104 by the conductive bonding agent 108. At this time, the vibration electrode 32a of the first piezoelectric resonator 24 is connected to the input electrode (not shown) on the alumina substrate 12C via the conductive bonding agent 108, the metallic block 104 and the conductive bonding agent 106.

The vibration electrode 32b of the first piezoelectric resonator 24 and the vibration electrode 42a of the fourth piezoelectric resonator 30 are connected to the vibration electrode 34a of the second piezoelectric resonator 26 via the conductive bonding agent 110. The vibration electrode 42b of the fourth piezoelectric resonator 30 is connected to the vibration electrode 38a of the third piezoelectric resonator 28 via the conductive bonding agent 112. Further, the vibration electrode 38a of the third piezoelectric resonator 28 is connected to the output electrode (not shown) on the alumina substrate 12C via a line metallic wire 114. The metallic wire 114 has its one end connected to the vibration electrode 38a and the other end connected to the output electrode (not shown) by a method, such as soldering such that solder bumps 116a and 116b connect the wire 114 to the electrode 38a and the substrate 12C, respectively.

Figure 11:
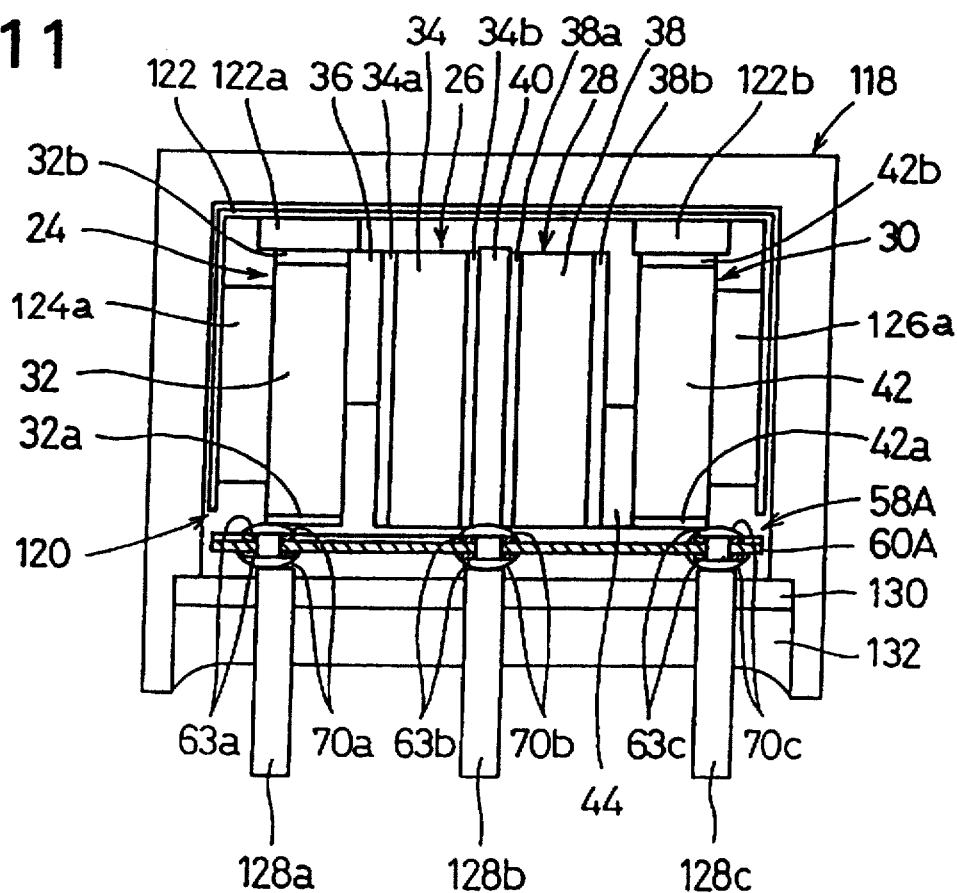
FIG. 11 is a partial sectional view illustrating a still further preferred embodiment of the present invention.
Figure 12:
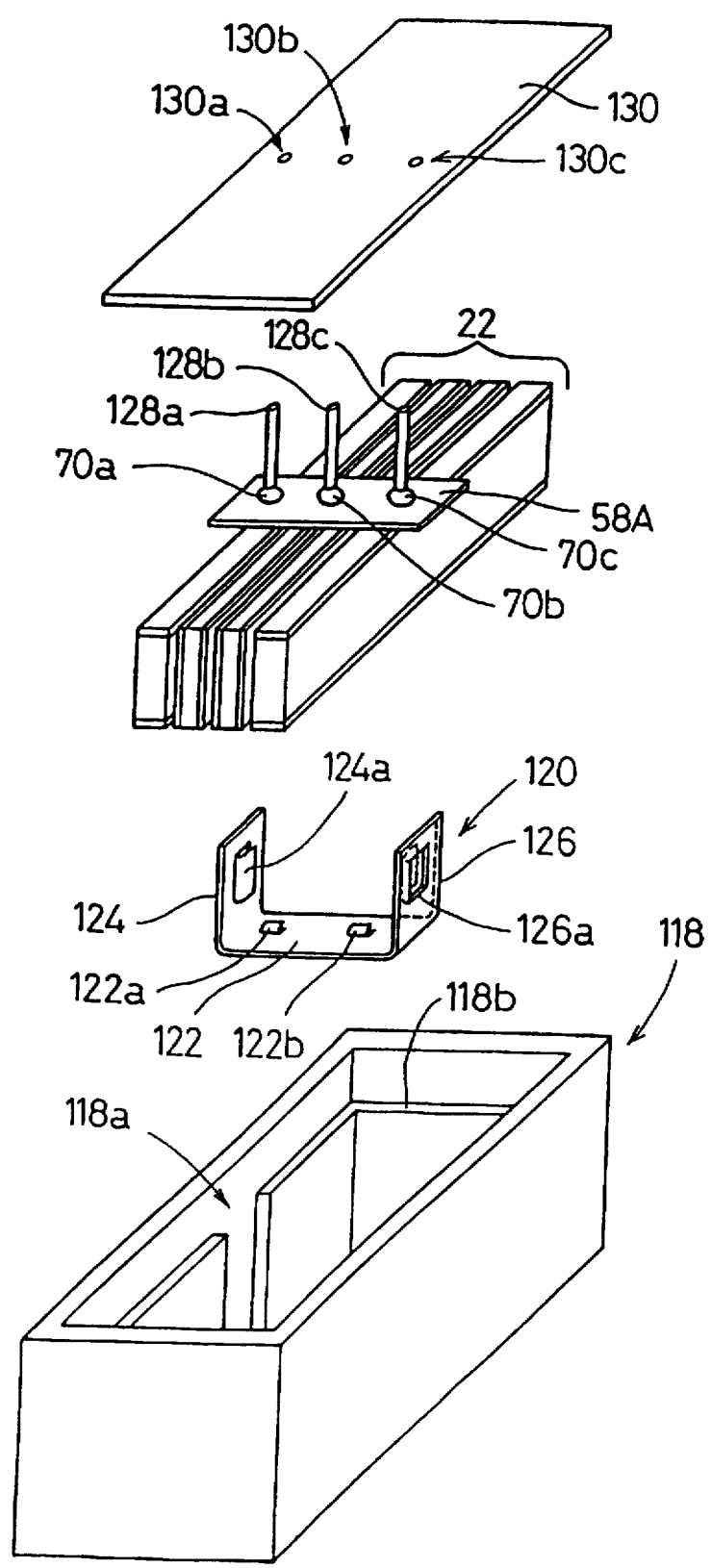
FIG. 12 is a perspective view illustrating the essential portion of the preferred embodiment shown in FIG. 11.

FIG. 11 is a front view illustrating a still further preferred embodiment of the present invention. FIG. 12 is an exploded view thereof. A particular difference between a ladder-type filter 10D of the preferred embodiment shown in FIGS. 11 and 12 and the ladder-type filter of the above-described preferred embodiments is that the resonator group provided with a buffer member is housed inside a resin case.

More specifically, in the preferred embodiment shown in FIGS. 11 and 12, the resonator group 22 is connected onto the surface of a support substrate 58A preferably having substantially the same construction as that of the buffer member 58 by a method, such as, soldering. The resonator group 22 provided with the support substrate 58A is housed inside a box-shaped case 11 8 having an opening 118a, as shown in FIG. 12. The case 118 is formed from a resin, such as a liquid-crystal polymer.

A relay terminal 120 which is formed substantially in a U shape is housed first inside the box-shaped case 118, and then the resonator group 22 provided with the support substrate 58A is housed therein.

The relay terminal 120 preferably includes a substantially rectangular relay portion 122. The relay portion 122 includes projection chips 122a and 122b which project inwardly with a predetermined spacing along the length of the relay portion 122. Bent portions 124 and 126 are arranged so as to extend at right angles from the end portions of the relay portion 122 respectively at one end and the other end of the length of the relay portion 122. Pressing chips 124a and 126a which project inwardly are located respectively at the center portion of the length of one bent portion 124 and at the center portion of the length of the other bent portion 126. The relay portion 122, the projection chips 122a and 122b, the bent portions 124 and 126, and the pressing chips 124a and 126a are formed as a single, unitary body by, for example, press-molding a metallic plate.

The relay terminal 120 is located first at a predetermined position inside the case 118, and then the resonator group 22 provided with the support substrate 58A is incorporated thereonto. In this case, the resonator group 22 provided with the support substrate 58A is incorporated in such a way that the projection chips 122a and 122b of the relay terminal 120 are brought into contact with the vibration electrode 32b of the first piezoelectric resonator 24 and the vibration electrode 42b of the fourth piezoelectric resonator 30, respectively. That is, the vibration electrode 32b of the first piezoelectric resonator 24 and the vibration electrode 42b of the fourth piezoelectric resonator 30 are electrically connected to each other via the projection chips 122a and 122b of the relay terminal 120, respectively. Inside the case 118, the pressing chips 124a and 126a of the relay terminal 120 function to stabilize the lateral setting of the resonator group 22 by resiliently holding the resonator group 22 from both sides of the resonator group 22 along the width of the resonator group 22.

Further, as shown in FIG. 11, bar-shaped lead terminals 128a, 128b, and 128c preferably made of a metal are connected to the electrodes 63a, 63b and 63c located on a substrate 60A by the connection members 70a, 70b and 70c, formed preferably of solder, respectively.

In such a case, the above-mentioned lead terminal 128a, used as an input terminal, is electrically connected to the vibration electrode 32a of the first piezoelectric resonator 24 via the connection member 70a, the electrode 63a on a substrate 60A and the line electrode 64. The above-mentioned lead terminal 128b, used as ground terminal, is electrically connected to the vibration electrode 34b of the second piezoelectric resonator 26 and the vibration electrode 38a of the third piezoelectric resonator 28 via the connection member 70b, the electrode 63b on the substrate 60A, and the line electrodes 66a and 66b. The above-mentioned lead terminal 128c, used as an output terminal, is electrically connected to the vibration electrode 42a of the fourth piezoelectric resonator 30 via the connection member 70c, the electrode 63c on the substrate 60A, and the line electrode 68.

A partition sheet 130 made of insulating paper or the like is inserted from above the three lead terminals 128a, 128b and 128c. In this case, the partition sheet 130 preferably has three holes 130a, 130b and 130c, with the lead terminals 128a, 128b and 128c being inserted through the holes 130a, 130b and 130c, respectively. In this state, the partition sheet 130 is set in the step portion 118b located inside the case 118. Further, the opening 118a of the case 118 is filled with a sealing resin 132, such as a heat-curing resin, thus the opening 118a is sealed.

In each of the above-described preferred embodiments, a two-stage ladder-type filter including four resonators, what is commonly called a four-element type, is provided. However, the present invention is not limited to a two-stage ladder-type filter of a four-element type. In addition to this type, the present invention may be applied to a one-stage ladder-type filter including two resonators, a three-stage ladder-type filter including six resonators, or a multi-stage ladder-type filter including seven or more resonators.

Many different embodiments of the present invention may be constructed without departing from the spirit and scope of the present invention. It should be understood that the present invention is not limited to the specific preferred embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A ladder-type filter comprising:

a first resonator including a first substantially rectangular piezoelectric substrate having a first upper major surface and a first lower major surface and a plurality of first side surfaces extending between said first upper major surface and said first lower major surface;

a first electrode disposed on a first of said first side surfaces of said first piezoelectric substrate;

a second electrode disposed on a second of said first side surfaces of said first piezoelectric substrate;

a second resonator including a second substantially rectangular piezoelectric substrate having a second upper major surface and a second lower major surface and a plurality of second side surfaces extending between said second upper major surface and said second lower major surface;

a third electrode disposed on said second upper major surface; and a fourth electrode disposed on said second major lower surface of said second piezoelectric substrate; and a support substrate supporting said first and second resonators and a buffer member disposed between said first and second resonators and said support substrate; wherein said first and second resonators are stacked on each other and arranged such that said third electrode disposed on said second upper major surface of said second piezoelectric substrate faces said first lower major surface of said first resonator and said first electrode disposed on said first of said first side surfaces of said first piezoelectric substrate is mechanically and electrically connected to said third electrode.

2. The ladder type filter of claim 1, wherein said first of said first side surfaces is disposed opposite to said second of said first side surfaces.

3. The ladder type filter of claim 1, wherein said first lower major surface of said first resonator does not have an electrode disposed thereon.

4. The ladder type filter of claim 1, further comprising a conductive bonding agent for mechanically and electrically connecting said first and second resonators via said first electrode and said third electrode.

5. The ladder type filter of claim 1, wherein said substrate includes an upper major surface and a lower major surface and a plurality of side surfaces connecting said upper and lower major surfaces, said first and second resonators being disposed on said upper major surface of said substrate such that said first electrode extends in a direction that is substantially parallel to said upper major surface of said substrate and said third electrode extends in a direction that is substantially perpendicular to said upper major surface of said substrate.

6. The ladder type filter of claim 1, further comprising:

a third resonator including a third substantially rectangular piezoelectric substrate having a third upper major surface and a third lower major surface and a plurality of third side surfaces extending between said third upper major surface and said third lower major surface;

a fifth electrode disposed on a first of said third side surfaces of said third piezoelectric substrate;

a sixth electrode disposed on a second of said third side surfaces of said third piezoelectric substrate;

a fourth resonator including a fourth substantially rectangular piezoelectric substrate having a fourth upper major surface and a fourth lower major surface and a plurality of fourth side surfaces extending between said fourth upper major surface and said fourth lower major surface;

a seventh electrode disposed on said fourth upper major surface; and an eighth electrode disposed on said fourth major lower surface of said fourth piezoelectric substrate; wherein said third and fourth resonators are stacked on each other and arranged such that said seventh electrode disposed on said fourth upper major surface of said fourth resonator faces said third lower major surface of said third resonator and said fifth electrode disposed on said first of said third side surfaces of said third piezoelectric substrate is mechanically and electrically connected to said seventh electrode.

7. The ladder type filter of claim 6, wherein said first, second, third and fourth resonators are stacked on each other and are mechanically and electrically connected to each other.

8. The ladder type filter of claim 6, wherein said first and second resonators are stacked on each other to define a first resonator group and said third and fourth resonators are stacked on each other to define a second resonator group, said first and second resonator groups being spaced from each other.

9. A ladder type filter comprising:

a first resonator including a first substantially rectangular piezoelectric substrate having a first upper major surface and a first lower major surface and a plurality of first side surfaces extending between said first upper major surface and said first lower major surface;

a first electrode disposed on a first of said first side surfaces of said first piezoelectric substrate;

a second electrode disposed on a second of said first side surfaces of said first piezoelectric substrate;

a second resonator including a second substantially rectangular piezoelectric substrate having a second upper major surface and a second lower major surface and a plurality of second side surfaces extending between said second upper major surface and said second lower major surface;

a third electrode disposed on said second upper major surface, and a fourth electrode disposed on said second major lower surface of said second piezoelectric substrate; and a support substrate supporting said first and second resonators and a case, said support substrate and said first and second resonators being disposed in said case, and a relay terminal disposed in said case so as to surround said first and second resonators, said relay terminal being mechanically and electrically connected to at least one of said first and second resonators; wherein said first and second resonators are stacked on each other and arranged such that said third electrode disposed on said second upper major surface of said second piezoelectric substrate faces said first lower major surface of said first resonator and said first electrode disposed on said first of said first side surfaces of said first piezoelectric substrate is mechanically and electrically connected to said third electrode.

10. A ladder type filter comprising:

a first resonator including a first substantially rectangular piezoelectric substrate having a first upper major surface and a first lower major surface and a plurality of first side surfaces extending between said first upper major surface and said first lower major surface;

a first electrode disposed on a first of said first side surfaces of said first piezoelectric substrate;

a second electrode disposed on a second of said first side surfaces of said first piezoelectric substrate;

a second resonator including a second substantially rectangular piezoelectric substrate having a second upper major surface and a second lower major surface and a plurality of second side surfaces extending between said second upper major surface and said second lower major surface;

a third electrode disposed on said second upper major surface; and a fourth electrode disposed on said second major lower surface of said second piezoelectric substrate; and a substrate having an upper major surface and a lower major surface and a plurality of side surfaces connecting said upper and lower major surfaces, said first and second resonators being disposed on said upper major surface of said substrate such that said first electrode extends in a direction that is substantially perpendicular to said upper major surface of said substrate and said third electrode extends in a direction that is substantially parallel to said upper major surface of said substrate; wherein said first and second resonators are stacked on each other and arranged such that said third electrode disposed on said second upper major surface of said second piezoelectric substrate faces said first lower major surface of said first resonator and said first electrode disposed on said first of said first side surfaces of said first piezoelectric substrate is mechanically and electrically connected to said third electrode.

11. The ladder type filter of claim 10, further comprising a support substrate supporting said first and second resonators and a block member disposed between said first resonator and said support substrate for supporting said first resonator spaced from said support substrate.

12. A ladder-type filter comprising:

a first resonator group including a first resonator having a first substantially rectangular piezoelectric substrate having a first upper major surface and a first lower major surface and a plurality of first side surfaces extending between said first upper major surface and said first lower major surface, a first electrode disposed on a first of said first side surfaces of said first piezoelectric substrate and a second electrode disposed on a second of said first side surfaces of said first piezoelectric substrate, a second resonator including a second substantially rectangular piezoelectric substrate having a second upper major surface and a second lower major surface and a plurality of second side surfaces extending between said second upper major surface and said second lower major surface, a third electrode disposed on said second upper major surface, a fourth electrode disposed on said second major lower surface of said second piezoelectric substrate, said first and second resonators being stacked on each other;

a second resonator group including a third resonator including a third substantially rectangular piezoelectric substrate having a third upper major surface and a third lower major surface and a plurality of third side surfaces extending between said third upper major surface and said third lower major surface, a fifth electrode disposed on a first of said third side surfaces of said third piezoelectric substrate, a sixth electrode disposed on a second of said third side surfaces of said third piezoelectric substrate, a fourth resonator including a fourth substantially rectangular piezoelectric substrate having a fourth upper major surface and a fourth lower major surface and a plurality of fourth side surfaces extending between said fourth upper major surface and said fourth lower major surface, a seventh electrode disposed on said fourth upper major surface, an eighth electrode disposed on said fourth major lower surface of said fourth piezoelectric substrate, said third and fourth resonators being stacked on each other; wherein said first and second resonator groups are spaced apart from each other;

said fourth electrode disposed on said second lower major surface of said second piezoelectric substrate faces said first upper major surface of said first piezoelectric substrate and said first electrode disposed on said first of said first side surfaces of said first piezoelectric substrate is mechanically and electrically connected to said fourth electrode;

said third and fourth resonators are arranged such that said eighth electrode disposed on said fourth lower major surface of said fourth piezoelectric substrate faces said third upper major surface of said third piezoelectric substrate and said fifth electrode disposed on said first of said third side surfaces of said third piezoelectric substrate is mechanically and electrically connected to said eighth electrode;

said first electrode disposed on said first of said first side surfaces of said first piezoelectric substrate and said sixth electrode disposed on said second of said third side surfaces of said third piezoelectric substrate are mechanically and electrically connected to each other; and said third electrode disposed on said second major upper surface of said second piezoelectric substrate and said seventh electrode disposed on said fourth major upper surface of said fourth piezoelectric substrate are mechanically and electrically connected to each other.

13. A ladder-type filter according to claim 12, further comprising a support substrate supporting said first and second resonator groups.

14. A ladder-type filter according to claim 13 further comprising a buffer member is disposed between said first and second resonator groups and said support substrate.

15. A ladder-type filter according to claim 14, further comprising a first conductive bonding member for mechanically and electrically connecting said first and second resonators, a second conductive bonding member for mechanically and electrically connecting said third and fourth resonators and a third conductive bonding member for electrically connecting said first and third resonators.

16. A ladder-type filter comprising:

a first resonator including a first substantially rectangular piezoelectric substrate having a first upper major surface and a first lower major surface and a plurality of first side surfaces extending between said first upper major surface and said first lower major surface;

a first electrode disposed on a first of said first side surfaces of said first piezoelectric substrate;

a second electrode disposed on a second of said first side surfaces of said first piezoelectric substrate;

a second resonator including a second substantially rectangular piezoelectric substrate having a second upper major surface and a second lower major surface and a plurality of second side surfaces extending between said second upper major surface and said second lower major surface;

a third electrode disposed on said second upper major surface;

a fourth electrode disposed on said second major lower surface of said second piezoelectric substrate;

a third resonator including a third substantially rectangular piezoelectric substrate having a third upper major surface and a third lower major surface and a plurality of third side surfaces extending between said third upper major surface and said third lower major surface;

a fifth electrode disposed on a first of said third side surfaces of said third piezoelectric substrate;

a sixth electrode disposed on a second of said third side surfaces of said third piezoelectric substrate;

a fourth resonator including a fourth substantially rectangular piezoelectric substrate having a fourth upper major surface and a fourth lower major surface and a plurality of fourth side surfaces extending between said fourth upper major surface and said fourth lower major surface;

a seventh electrode disposed on said fourth upper major surface;

an eighth electrode disposed on said fourth major lower surface of said fourth piezoelectric substrate; and a support substrate supporting said first and second resonators and a buffer member disposed between said first and second resonators and said support substrate; wherein said first, second, third and fourth resonators are stacked on each other and arranged such that said third electrode disposed on said second upper major surface of said second piezoelectric substrate faces said first lower major surface of said first resonator and said first electrode disposed on said first of said first side surfaces of said first piezoelectric substrate is mechanically and electrically connected to said third electrode, said third and fourth resonators are arranged such that said seventh electrode disposed on said fourth upper major surface of said fourth piezoelectric substrate faces said third lower major surface of said third piezoelectric substrate and said fifth electrode disposed on said first of said third side surfaces of said third piezoelectric substrate is mechanically and electrically connected to said seventh electrode.

17. A ladder-type filter comprising:

a first resonator including a first substantially rectangular piezoelectric substrate having a first upper major surface and a first lower major surface and a plurality of first side surfaces extending between said first upper major surface and said first lower major surface;

a first electrode disposed on a first of said first side surfaces of said first piezoelectric substrate;

a second electrode disposed on a second of said first side surfaces of said first piezoelectric substrate;

a second resonator including a second substantially rectangular piezoelectric substrate having a second upper major surface and a second lower major surface and a plurality of second side surfaces extending between said second upper major surface and said second lower major surface;

a third electrode disposed on said second upper major surface of said piezoelectric substrate;

a fourth electrode disposed on said second major lower surface of said second piezoelectric substrate;

a third resonator including a third substantially rectangular piezoelectric substrate having a third upper major surface and a third lower major surface and a plurality of third side surfaces extending between said third upper major surface and said third lower major surface;

a fifth electrode disposed on a first of said third side surfaces of said third piezoelectric substrate;

a sixth electrode disposed on a second of said third side surfaces of said third piezoelectric substrate; and a fourth resonator including a fourth substantially rectangular piezoelectric substrate having a fourth upper major surface and a fourth lower major surface and a plurality of fourth side surfaces extending between said fourth upper major surface and said fourth lower major surface;

a seventh electrode disposed on said fourth upper major surface of said fourth piezoelectric substrate; and an eighth electrode disposed on said fourth major lower surface of said fourth piezoelectric substrate; wherein said second resonator and said fourth resonator are spaced apart from each other, said third resonator is stacked on said second and said fourth resonators so as to extend between said second and said fourth resonators, and said first resonator is stacked on said second resonator such that said first resonator is spaced from said third resonator.

18. A ladder-type filter according to claim 17, further comprising a support substrate supporting said first and second resonators and a block member disposed between said first resonator and said support substrate for supporting said first resonator spaced from said support substrate.

19. The ladder type filter of claim 17, wherein said first electrode disposed on said first of said side surfaces of said first piezoelectric substrate and said fifth electrode disposed on said first of said third side surfaces of said third piezoelectric substrate and said third electrode disposed on said second upper major surface of said second piezoelectric substrate are electrically and mechanically connected to each other;

said sixth electrode disposed on said second of said third side surfaces of said third piezoelectric substrate and said seventh electrode disposed on said fourth upper major surface of said fourth piezoelectric substrate are mechanically and electrically connected to each other;

said fourth electrode disposed on said second major lower surface of said second piezoelectric substrate and said eighth electrode disposed on said fourth major lower surface of said fourth piezoelectric substrate are mechanically and electrically connected to each other.

20. A ladder-type filter according to claim 17, further comprising a first conductive bonding member for mechanically and electrically connecting said first and second resonators, a second conductive bonding member for mechanically and electrically connecting said third and fourth resonators and a third conductive bonding member for electrically and mechanically connecting said second and fourth resonators.

21. A ladder-type filter according to claim 17, further comprising a support substrate supporting said second and fourth resonators.

22. A ladder-type filter according to claim 21, further comprising a buffer member is disposed between said first and second resonator groups and said support substrate.

* * * * *